United States Patent [19]

Nakane et al.

[11] Patent Number: 4,588,675

[45] Date of Patent: May 13, 1986

[54] METHOD FOR FINE PATTERN FORMATION ON A PHOTORESIST

[75] Inventors: Hisashi Nakane, Kawasaki; Akira Yokota, Yamato; Mitsuo Yabuta, Samukawa; Wataru Ishii, Hadano, all of Japan

[73] Assignee: Tok Yo Ohka Kogyo Co., Ltd., Kawasaki, Japan

[21] Appl. No.: 672,764

[22] Filed: Nov. 19, 1984

[30] Foreign Application Priority Data

Nov. 28, 1983 [JP] Japan .............................. 58-221984

[51] Int. Cl.⁴ ............................................. G03F 7/26
[52] U.S. Cl. .................................. 430/325; 430/197; 430/296; 430/330; 430/967
[58] Field of Search ............... 430/330, 323, 325, 197, 430/296, 326, 967

[56] References Cited

U.S. PATENT DOCUMENTS

| | | | |
|---|---|---|---|
| 4,015,986 | 4/1977 | Paal et al. | 430/330 |
| 4,241,165 | 12/1980 | Hughes et al. | 430/330 |
| 4,292,384 | 9/1981 | Straughan et al. | 430/323 |
| 4,307,176 | 12/1981 | Mochiji et al. | 430/330 |
| 4,388,397 | 6/1983 | Kanai | 430/197 |
| 4,401,745 | 8/1983 | Nakane et al. | 430/197 |
| 4,409,319 | 10/1983 | Colacino et al. | 430/323 |
| 4,433,044 | 2/1984 | Meyer et al. | 430/323 |
| 4,439,516 | 3/1984 | Cernigliaro et al. | 430/323 |
| 4,465,768 | 8/1984 | Ueno et al. | 430/197 |
| 4,497,891 | 2/1985 | Kaplan et al. | 430/323 |
| 4,540,650 | 9/1985 | Klug et al. | 430/330 |
| 4,547,455 | 10/1985 | Hiramoto et al. | 430/330 |
| 4,551,409 | 11/1985 | Gulla et al. | 430/197 |

OTHER PUBLICATIONS

Walker, E. J., *IEEE Transactions on Electron Devices*, vol. ED-22, No. 7, 7/1975.

*Primary Examiner*—Charles L. Bowers, Jr.
*Attorney, Agent, or Firm*—Armstrong, Nikaido, Marmelstein & Kubovcik

[57] ABSTRACT

A method for high fidelity patterning of a photoresist layer involving a dry-process development by exposure to a plasma gas. A photoresist layer which had been irradiated in a pattern with actinic rays is heated at a temperature in the range from 200° to 500° C. by applying heat to the surface of the substrate opposite to the surface bearing the photoresist layer, for example, by placing the substrate on a hot plate with the uncoated surface in contact with the hot plate. Subsequent exposure to plasma gas gives a patterned resist layer with a very high residual film thickness.

2 Claims, No Drawings

METHOD FOR FINE PATTERN FORMATION ON A PHOTORESIST

BACKGROUND OF THE INVENTION

The present invention relates to a method for forming a patterned photoresist layer on a substrate or, more particularly, to a method for forming a patterned photoresist layer on a substrate in which a layer of the photoresist material is subjected to irradiation in a pattern with actinic rays followed by dry-process developing by exposure to an atmosphere of plasma gas.

As is well known, the manufacture of semiconductor devices in the semiconductor industry is performed in a number of processing steps, typically including photolithography. The photolithography step is usually performed by use of a photoresist material which is a type of photosensitive composition. In a typical process of photolighography, a silicon wafer is first provided with a thin undercoating film of aluminum, silicon oxide, silicon nitride, polysilicon and similar material having a thickness of several hundreds of nanometers and then with a coating layer of a photoresist composition. The photoresist layer is then irradiated in a pattern with actinic rays such as ultraviolet light through a photomask having a desired pattern, followed by development with a suitable developer liquid or solution to give a patterned layer of photoresist. This patterned layer serves as a protective mask for the thin undercoating film in a subsequent etching step whereby the thin undercoating film in the unprotected areas is removed, exposing the substrate surface. Finally, the patterned photoresist layer is removed to expose the undercoating which had not been etched and remains in a pattern corresponding to the photomask pattern.

The above-described process of photolithography includes as an essential step development by a wet process using a developer liquid. A problem in wet process development is that the film of photoresist in the areas where the photoresist is not to be removed absorbs the developer liquid and becomes swollen so that the method is not quite satisfactory or practical when the pattern of the photoresist layer formed on the substrate is extremely fine. In addition, the developer liquid which usually is or contains an organic solvent causes serious problems related not only to workers' health but also to environmental pollution.

Accordingly, a recent trend has been to replace the wet-process development which has the inherent problems and disadvantages described above with a so-called dry-process development. In dry process development the photoresist layer on the substrate surface is first irradiated in a pattern with actinic rays and, then, subjected to a treatment so as to produce a difference between the irradiated and unirradiated areas of the photoresist layer in its resistance against exposure to an atmosphere of plasma gas. The effect of the plasma gas is to ash and remove the photoresist layer in the areas where the photoresist layer has less resistance against the plasma gas, leaving a patterned layer of the photoresist composition on the substrate surface. Because no developer liquid is used at all, dry-process development is very advantageous when a very fine pattern of the photoresist layer is desired. In addition, problems associated with workers' health and environmental pollution are avoided, so that this method is highly valued in the modern semiconductor industry.

A typical procedure is reported in Japanese Patent Kokai 58-60537 for patterning a resist layer by a dry-process development according to which the resist layer is irradiated in a pattern with actinic rays, and then subjected to heat treatment at 80° to 180° C. for at least 5 minutes, followed by development by exposure to an atmosphere of plasma gas. In this method, however, it is not possible to achieve a sufficiently large difference in the resistance against the plasma atmosphere, between the areas irradiated and unirradiated with the actinic rays. Based upon this the residual film thickness or the residual film ratio in the patterned resist layer is small, and the cross section of a linewise patterned resist layer is trapezoidal with a broader bottom. Therefore, the dimensional accuracy in the patterning of the resist layer is relatively poor and the method is not always satisfactory when high fidelity is desired in the reproduction of a very fine pattern.

SUMMARY OF THE INVENTION

An object of the present invention is, therefore, to provide an improved method for forming a patterned photoresist layer in a dry process that is free from the problems and disadvantages associated with the prior art methods as described above.

The method of this invention for finely patterning a photoresist layer was established as a result of extensive investigations conducted by the inventors. Such method comprises the steps of irradiating a layer of a photoresist formed on one surface of a substrate plate in a pattern with actinic rays, heating the photoresist layer at a temperature in the range from 200° to 500° C. by applying heat to the other surface of the substrate plate, and exposing the photoresist layer to an atmosphere of a plasma gas so as to decompose and remove the photoresist material in the areas not irradiated with the actinic rays.

DETAILED DESCRIPTION OF THE PREFERRED EMBODIMENTS

The resist material used in the inventive method may be any one of the negative-type photoresist materials conventionally used in photolithography. A preferable resist material is a composition comprising a polymer and an azide compound. The polymer should have such properties that the layer of resist formed on the surface of a substrate has no surface tackiness, and that the layer of resist material can readily be decomposed and removed when it is exposed to an atmosphere of a plasma gas. Several examples of preferable polymers include polymethyl methacrylate, poly(methyl isopropenyl ketone), poly(glycidyl acrylate), poly(glycidyl methacrylate), copolymers of glycidyl meth-acrylate and methyl methacrylate, polyvinyl chloride, polyvinyl acetate, copolymers of vinyl chloride and vinyl acetate, copolymers of vinyl chloride and acrylic acid, poly(isopropyl vinyl ketone), polybutyl methacrylate, poly(2,3-dichloro-1-propyl acrylate), poly(1,3-dichloro-1-propyl acrylate), and poly(2-chloroethyl acrylate).

The azide compound to be combined with the above polymeric material in the photoresist composition is preferably selected from the class consisting of: 1-azidopyrene, 1.8-diazidonaphthalene, 4,4'-diazidostilbene, 4,4'-diazidochalcone, 4,4'-diazidodibenzalacetone, 2,6-di(4'-azidobenzal) cyclohexanone, 2,6-di(4'-azidobenzal)-4-methylcyclohexanone, 4.4'-diazidodiphenyl ether, 4,4'-diazidomethane, 4,4'-diazidodiphenyl sulfide, 3,3'-diazidodiphenyl sulfone, 4,4'-diazidodiphenyl sulfone, 2,2'-diazidostilbene, 4,4'-diazidobiphenyl, 3,3'-dimethyl-4,4'-diazidobiphenyl, S 1-azidophenanthrene and the like.

The coating solution for forming the photoresist layer is prepared by dissolving the polymer and the azide compound in one, or a mixture of two or more, of the organic solvents named below. Usable organic solvents are exemplified by cyclohexanone, methyl n-butyl ketone, methyl n-propyl ketone, ethyl n-butyl ketone, ethyleneglycol monomethyl ether acetate, ethyleneglycol monoethyl ether acetate, toluene, xylene, 1-nitropropane, 2-nitropropane, 1.1,2,2-tetrachloroethane, and N,N dimethyl formamide.

The coating solution prepared in this manner is uniformly applied to the surface of a substrate such as a silicone wafer by use of, for example, a spinner rotatable at such a controlled velocity as to give a desired thickness of the coating film. The substrate coated with the coating solution is dried, for example, in a hot-air drying oven to evaporate and remove the solvent in the solution so that a coating film of the photoresist composition is formed thereon. Subsequent, the photoresist layer is irradiated in a pattern with actinic rays. The actinic rays may be corpuscular beams or electromagnetic waves, including electron beams and ion beams as an example of the former and x-rays, ultraviolet light and far-ultraviolet light as the examples of the latter.

Next the photoresist layer is heated at a temperature in the range from 200° to 500° C. by applying heat to the surface of the substrate that is not coated with the photoresist layer. It is essential in this heat treatment that heat is applied not to the surface of the substrate that is adjacent to the photoresist layer, but only to the other surface of the substrate, so as to cause a temperature gradient between the surface in contact with the photoresist and the free surface. A preferable and convenient method for performing such a heat treatment is to mount the substrate provided with the photoresist layer on a hot plate heated at the desired controlled temperature in the range from 200° to 500° C., in such a manner that the surface of the substrate that is not coated with the photoresist is in contract with the hot plate. Thus, the photoresist layer is heated from below by heat conducted from the hot plate through the substrate. The duration of the heat treatment preferably should be relatively long, though this is not a particular limitation of the invention. It should be noted also that it may be common for the photoresist layer also soften and eventually flow when it is heated prolongedly at a temperature of 200° C. or higher. Thus, the heating schedule should be selected accordingly so as not to cause such a problem. As a rough guideline, the heating time should be about 4 minutes at 200° C. and about 1 second at 500° C. When the temperature of the heat treatment is lower than 200° C., the photoresist layer on the areas irradiated with the actinic rays cannot be imparted with full resistance against the plasma atmosphere so that the residual film ratio may be undesirably low in the finished pattern of the photoresist layer. On the other hand, higher temperatures than 500° C. are undesirable due to the decreased developability and poor fidelity in pattern reproduction.

After the irradiation and heat treatment described above the photoresist layer on the substrate is then exposed to an atmosphere of plasma gas in an apparatus for plasma treatment, so that the photoresist layer in the area unirradiated with the actinic rays is selectively decomposed and removed from the surface of the substrate to leave a patterned layer of the photoresist. The plasma gas introduced into the plasma chamber for this dry-process development is exemplified by, but not limited to, oxygen, carbon tetrafluoride, and mixtures of oxygen with carbon tetrafluoride or argon.

The above described heat treatment following irradiation with actinic rays has the effect of rearranging the composition of the polymer and the azide compound which had become crosslinked as a result of the irradiation. The rearrangement produces a structure capable of deactivating the excitation energy imparted by the plasma gas, so that the resistance of the photoresist layer against the plasma gas is greatly increased. On the other hand, the heat treatment has the effect of decomposing or deactivating the unreacted azide compound in the photoresist composition in the areas unirradiated. Thus, a large difference is obtained in the resistance of the photoresist layer against the plasma gas between the areas irradiated and unirradiated with the actinic rays. Therefore, subsequent exposure of the photoresist layer to a plasma gas readily and selectively ashes the photoresist composition in the areas unirradiated with the actinic rays so that the photoresist is removed. The photoresist layer in the irradiated areas is left in a pattern on the substrate, with a relatively small decrease in the thickness of the photoresist layer.

The most characteristic feature of the inventive method is in the temperature of 200° to 500° C. used for the heat treatment, such temperature being much higher than the temperature of the heat treatment involved in conventional processes. This produces an unexpectedly large difference in the resistance of the photoresist layer against the plasma gas between the areas irradiated and unirradiated with the actinic rays, so that the patterned photoresist layer after the dry-process development with the plasma gas has a high residual film ratio.

The heat treatment should be performed essentially by applying heat to the surface of the substrate on the reverse side of the surface coated with the photoresist layer. That is, the photoresist layer is heated starting at the bottom surface, i.e. the interface with the substrate, so that the heat treatment of the bottom surface can be very complete in contrast to the heat treatment in conventional methods where the effect of the heat treatment is unavoidably incomplete at the bottom surface. As a consequence, the cross section of a line pattern obtained after the dry-process development with a plasma gas is not trapezoidal with a larger width at the bottom, but may advantageously be rectangular. Furthermore, the heat treatment thus carried out, for example, by placing the substrate plate on a hot plate, is advantageous because of the stability of the photoresist composition under the heat treatment at a relatively high temperature of 200° C. or higher. In contrast, the temperature used in conventional methods of heat treatment conducted in a hot air oven cannot be higher than 200° C. due to the danger of flowing taking place in the photoresist layer when the temperature is excessively high. The stability of the photoresist composition greatly contributes to the formation of a patterned photoresist layer having a very high residual film ratio.

In the following, the method of the present invention is described in more detail by way of examples.

EXAMPLE 1

A photosensitive composition was prepared by dissolving 10 g of a poly(methyl isopropenyl ketone) having an average molecular weight of about 200,000 and 3 g of 2,6-di(4-azidobenzal)-4-methyl cyclohexanone in about 90 g of cyclohexanone. The solution was applied to a silicon wafer on a spinner rotating at 3000 rpm for 30 seconds, followed by drying for 20 minutes in a hot air oven kept at 85° C. to evaporate the solvent in the coating film. The formed photoresist layer was then subjected to a 4-count hard-contact exposure in a pattern to far ultraviolet light on an apparatus for ultraviolet exposure (Model PLA-520F, manufactured by Canon Co.) equipped with a cold mirror (Model CM-290) through a photomask used for testing resolving power and having a line pattern of 0.5um width at the finest point. Two silicon wafers were processed in the same manner as described above and then each subjected to heat treatment by placing on a hot plate kept at 200° C. or 500° C., for 4 minutes or 1 second, respectively.

Thereafter, each of the thus heat-treated silicon wafers was subjected to dry-process development by exposing to an atmosphere of oxygen gas plasma for 60 seconds on a table kept at a temperature of 105° C. in an apparatus for plasma treatment (Model OAPM-300, manufactured by Tokyo Ohka Kogyo Co.) in which the oxygen gas plasma was generated by supplying a RF output of 25 watts at a frequency of 13.56 MHz with the oxygen gas flow at a rate of 200 ml/minute under a pressure of 1.0 Torr. The results of the dry-process development were quite satisfactory irrespective of the temperature of the heat treatment, and the residual film ratio of the patterned photoresist layer was 90% on each of the silicon wafers. The fidelity in the reproduction of the test pattern was excellent even in the finest line pattern of 0.5 um width, and the cross section of the patterned lines of the photoresist layer had good rectangularity without broadening at the bottom.

COMPARATIVE EXAMPLE 1

The experimental procedure was substantially the same as in Example 1 above except that the heat treatment following the exposure in a pattern of the photoresist layer to far ultraviolet light was performed by keeping the silicon wafer in a hot air oven kept at 140° C. for 5 minutes instead of placing on a hot plate. The residual film ratio of the patterned photoresist layer was 80% and the cross section of the patterned lines was trapezoidal with a broader bottom.

EXAMPLE 2.

Essentially the same experimental procedure as in Example 1 was repeated, except that the photosensitive composition was prepared by dissolving 10 g of a polymethyl methacrylate having an average molecular weight of about 600,000 and 3 g of 4,4'-diazidochalcone in about 90 g of ethyleneglycol monoethyl ether acetate. The results were as satisfactory as in Example 1 irrespective of the temperature of 200° C. or 500° C. in the heat treatment following the exposure in a pattern of the photoresist layer to ultraviolet light to give a patterned photoresist layer of high fidelity having a finest width of 0.5um. The residual film ratio was 90% and the cross section of the patterned lines had good rectangularity.

EXAMPLE 3

A photosensitive composition in the form of a solution was prepared by dissolving 5 g of a poly(methyl isopropenyl ketone) having an average molecular weight of about 180,000 and 1 g of 3,3'-dimethyl-4,4'-diazidobiphenyl in about 50 g of cyclohexanone. The solution was applied to a silicon wafer by use of a spinner rotating at 3000 rpm for 30 seconds. The wafer was then dried for 20 minutes in a hot air oven kept at 80° C. The thus formed photoresist layer on the silicon wafer was then irradiated in a spot pattern with electron beams for 30 seconds in a scanning electron microscope (Model HHS-2R, manufactured by Hitachi ltd.) operating with an electron beam current of $5 \times 10^{-10}$ to give an intensity of irradiation of $9.62 \times 10^{-6}$ C/cm$^2$.

Two silicon wafers were processed in the above described manner and then subjected to heat treatment (one by placing on a hot plate kept at 200° C. for 4 minutes and the other by placing on a hot plate kept at 500° C. for 1 second) followed by dry-process development in the same manner as in Example 1 to give a patterned photoresist layer on each of the silicon wafers. The quality of the finely patterned photoresist layer was as satisfactory as in Example 1 irrespective of the temperature of the heat treatment.

EXAMPLE 4

Substantially the same experimental procedure as in Example 1 was repeated except that the heat treatment following the exposure in a pattern of the photoresist layer to the far ultraviolet light was performed by placing the silicon wafer on a hot plate kept at 300° C. for 10 seconds or on a hot plate kept at 400° C. for 5 seconds. The quality of the thus obtained patterned photoresist layer was quite satisfactory, with high fidelity of reproduction of a pattern having a finest line width of 0.5 $\mu$m. The residual film ratio was 90% and the cross section of the patterned lines had good rectangularity without a broadened bottom.

What is claimed is:

1. A method for finely patterning a photoresist layer on a substrate which comprises the steps of:
    (a) forming a layer of a negative-type photoresist composition comprising polymer and azide compound on a surface of a substrate;
    (b) irradiatinig the photoresist layer in a pattern with actinic rays;
    (c) heating the photoresist layer after exposure to the actinic rays at a temperature in the range from 200° to 500° C. by applying heat to the surface of the substrate plate which is not coated with the photoresist layer; and
    (d) exposing the photoresist layer to an atmosphere of a plasma gas after heating the photoresist so as to decompose and remove the photoresist composition in the areas not irradiated with the actinic rays.

2. The method for patterning a photoresist layer on a substrate as claimed in claim 1 wherein the photoresist layer is heated in step (c) by placing the substrate plate on a hot plate kept at a temperature in the range from 200° to 500° C., with the surface which is not coated with the photoresist layer being in contact with the hot plate.

* * * * *

UNITED STATES PATENT AND TRADEMARK OFFICE
CERTIFICATE OF CORRECTION

PATENT NO. : 4,588,675

DATED : May 13, 1986

INVENTOR(S) : Hisashi NAKANE et al

It is certified that error appears in the above-identified patent and that said Letters Patent is hereby corrected as shown below:

On the cover page, Item [73], "Tok Yo Ohka Kogyo Co., Ltd." should read --Tokyo Ohka Kogyo Co., Ltd.--.

Column 2, line 53, "meth-acrylate" should read --methacrylate--;
          line 60, "above" should read --above named--;
          line 65, "4,4'-diazidomethane" should read --4,4'-diazidodiphenylmethane--.

Column 3, line 2, "S 1-azidophenanthrene" should read --1-azidophenanthrene--;
          line 12, "1.1,2,2-tetrachloroethane" should read --1,1,2,2-tetrachloroethane--;
          line 13, N,N dimethyl" should read --N,N-dimethyl--;
          line 16, "silicone" should read --silicon--;
          line 22, "Subsequent," should read --Subsequently--.

Column 5, line 13, "0.5um" should read --0.5$\mu$m--;
          line 34, "0.5um" should read --0.5$\mu$m--;
          line 62, "0.5um" should read --0.5$\mu$m--;

Column 6, line 15, "5 x 10-10" should read --5 x $10^{-10}$A--.

Signed and Sealed this

Thirtieth Day of December, 1986

Attest:

DONALD J. QUIGG

Attesting Officer      Commissioner of Patents and Trademarks